United States Patent [19]

Belfield

[11] Patent Number: 4,475,227

[45] Date of Patent: Oct. 2, 1984

[54] ADAPTIVE PREDICTION

[75] Inventor: William R. Belfield, Tinton Falls, N.J.

[73] Assignee: AT&T Bell Laboratories, Murray Hill, N.J.

[21] Appl. No.: 368,394

[22] Filed: Apr. 14, 1982

[51] Int. Cl.$^3$ .................. G10L 1/00; H03K 13/01
[52] U.S. Cl. ............................ 381/30; 340/347 DD; 375/27
[58] Field of Search .................... 381/29–35; 375/27, 122; 340/347 DD; 332/11 D

[56] References Cited

U.S. PATENT DOCUMENTS

| | | | |
|---|---|---|---|
| 3,973,081 | 8/1976 | Hutchins | 381/30 |
| 4,140,876 | 2/1979 | Gagnon | 381/30 |
| 4,437,087 | 3/1984 | Petr | 340/347 DD |

OTHER PUBLICATIONS

CCITT Study Group, XVIII Contribution No. FR 3, Apr. 1981, "32 kbits/s ADPCM Codecs", Question 7/XVIII, pp. 1–15.
IEEE Trans. on Communications, May–Jun. 1982, "A 60 Channel PCM-ADPCM Converter", J. M. Raulin, G. Bonnerot, J. L. Jeandot and R. Lacroix.
IEEE Proceedings, vol. 68, No. 4, "Adaptive Prediction in Speech Differential Encoding Systems", by J. D. Gibson, pp. 488–525, Apr. 1980.
ICASSP Conf. Proc., Mar.–Apr. 1981, "Performance of a 32 kbits/s ADPCM CODER for Digital Long–Haul Telephone Transmission", Bonnerot et al., pp. 848–851.
Internat'l Conf. on Communications, Jun. 1981, "Digital PCM-ADPCM Converter for Digital Tandem Connections", Bonnerot et al., pp. 62.4.1 through 62.4.5.

Primary Examiner—E. S. Matt Kemeny
Attorney, Agent, or Firm—John K. Mullarney

[57] ABSTRACT

An improved Adaptive Predictor Circuit for use in an Adaptive Differential PCM Coding system (ADPCM) uses tap coefficient values to determine adaptation rate. The stability margin of a fourth order adaptive predictor is improved by dynamically changing the adaptation speed of the tap coefficients $(a_i)$ depending upon the location of the poles with respect to the unit circle in the Z domain. The predictor comprises a 4-tap adaptive transversal filter (31) and a coefficient update circuit (32) for the same. The output of the coefficient update $a_i$ (where i = 1,2,3,4) is also delivered to a logic circuit (34) which calculates a predetermined function of the tap coefficients. If the calculated function is greater than a given threshold, an input speech or voiceband data signal is concluded and a normal speed of adaptation is permitted. However, if the calculated function is less than the threshold, a narrowband signal is indicated and the adaptation speed is substantially reduced.

9 Claims, 3 Drawing Figures

ADAPTIVE PREDICTION

TECHNICAL FIELD

The present invention relates to adaptive prediction in differential PCM coding of speech, voiceband data, and narrowband signals (e.g., tones).

BACKGROUND OF THE INVENTION

Over the past several years there has been, and continues to be, a tremendous amount of activity in the area of efficient encoding of speech and voiceband data. A large number of digital coding algorithms are being investigated for a wide variety of applications. For an evolving digital telephone network, a most important application is the possible replacement of the 64,000 bit-per-second (bps) PCM signal (8 bits per time slot, repeated at an 8 kHz rate) for telephony—both in the public switched and private line networks. The reason, of course, is to achieve bandwidth compression. The dilemma for telephony planners is easily posed but not so easily answered—should such a network evolve toward a coding algorithm more efficient than 64 kb/s PCM and, if so, which algorithm is preferable? A number of different digital coding algorithms and related techniques have been proposed heretofore, namely: Adaptive Differential PCM (ADPCM); Sub-Band Coding (SBC); Time Domain Harmonic Scaling (TDHS); vocoder-driven Adaptive Transform Coding (ATC), etc.

As indicated in the co-pending application of D. W. Petr, Ser. No. 343,355, filed Jan. 27, 1982 now U.S. Pat. No. 4,437,087, issued Mar. 13, 1984 and assigned to the same assignee, for a realistic mix of input speech and voiceband data, the ADPCM approach appears to be the most promising. And, as further disclosed in the Petr application, the ADPCM CODEC (coder-decoder) preferably incorporates adaptive predictors. The adaptive predictors and more particularly, the coefficient update circuit utilized by the same, should have two speeds of operation. A first or normal speed for speech and voiceband data and a second, substantially reduced speed for narrowband signals, such as tones and certain voiceband data signals. By reducing the speed of the coefficient update circuit(s), the ADPCM CODEC's performance is significantly improved. If the speed of the coefficient update circuit is not changed, then in order to ensure good performance for narrowband signals (e.g., tones), it is necessary to fix the speed of operation at the lower of the two speeds. This, however, results in degradation of the voiceband data and speech signals, and so the net effect is a degradation in the overall desired performance of the ADPCM operation.

The adaptive predictor circuit disclosed in the Petr application is particularly advantageous in that it is of a relatively simple and yet a quite reliable design. However, it is not as robust as one might desire in the presence of narrowband signals (tones). Other, prior art, adaptive predictors are known to be more robust, but unfortunately they are typically of complex design.

SUMMARY OF THE INVENTION

It is a primary object of the present invention to achieve a highly robust, adaptive prediction without resorting to complex design.

A related object is to improve on the identification of those narrowband signals that cause increased ADPCM CODEC sensitivity to transmission errors.

The present invention serves to improve the stability margin of an $n^{th}$ order adaptive predictor (e.g., fourth order) by dynamically changing the adaptation speed of the tap coefficients depending upon the location of the poles with respect to the unit circle in the Z domain. This has the effect of increasing the stability margin for narrowband signals (e.g., tones) but does not degrade the performance for other signals, such as speech and voiceband data.

A preferred embodiment of the invention comprises a 4-tap adaptive transversal filter and a coefficient update circuit for the same. The output of the coefficient update ($a_i$, where $i=1,2,3,4$) is also delivered to a logic circuit, in accordance with the invention, which serves to identify those narrowband signals that cause increased ADPCM CODEC sensitivity to transmission errors. The logic circuit calculates a predetermined function of the tap coefficients ($a_1,a_2,a_3,a_4$) and if that function is greater than a given threshold, a narrowband signal is not present and a normal speed of operation of the coefficient update circuit is permitted. However, if the calculated function is less than the threshold, a narrowband signal is concluded and the speed of the coefficient update circuit is substantially reduced.

It is a feature of the invention that the above described functions or operations can be carried out digitally, and therefore, an adaptive predictor designed in accordance with the invention can be readily implemented in integrated circuit form or, alternatively, through the use of a digital signal processor.

BRIEF DESCRIPTION OF THE DRAWING

The invention will be more fully appreciated from the following detailed description when the same is considered in connection with the accompanied drawings, in which.

DETAILED DESCRIPTION

Figure 1:
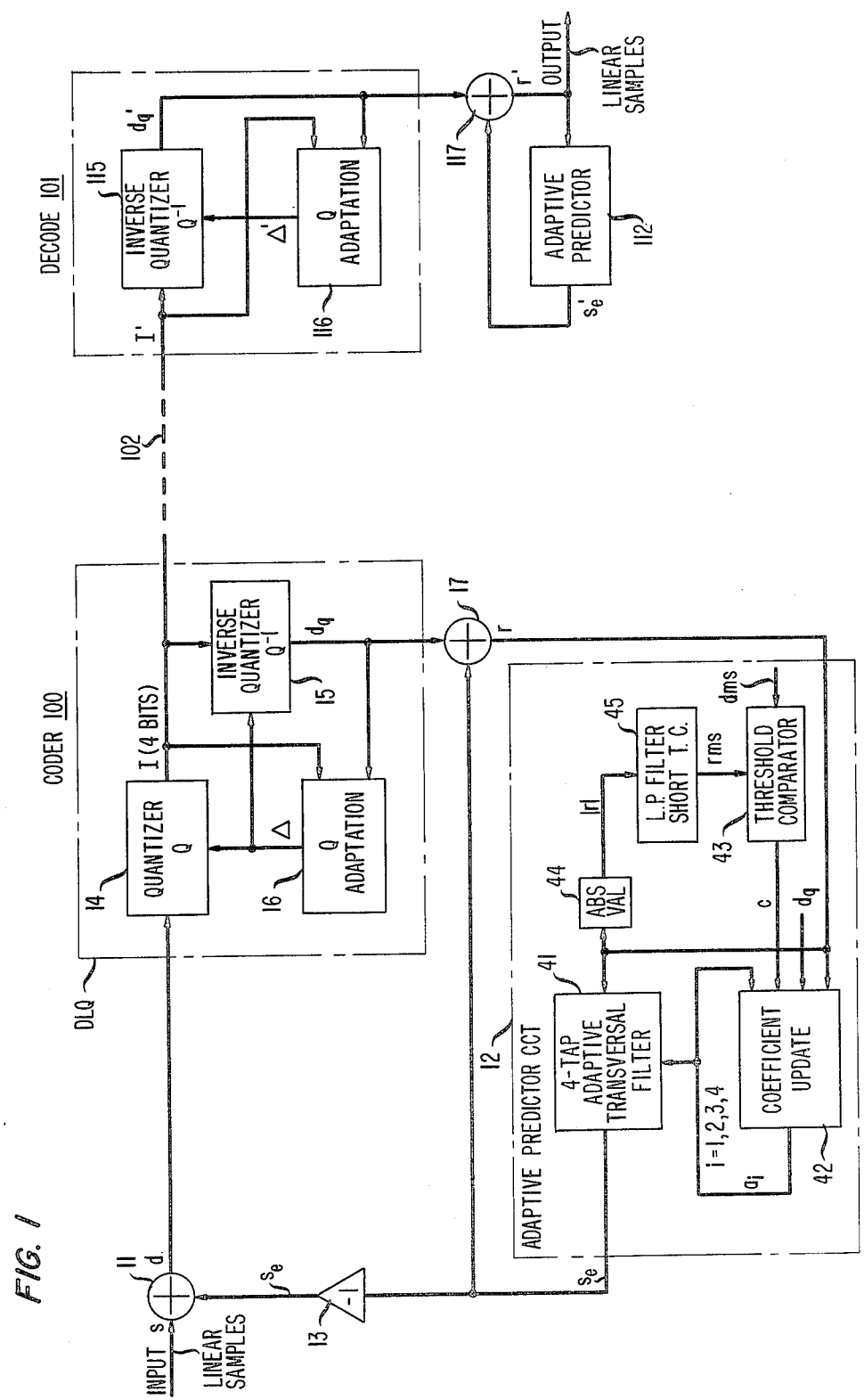
FIG. 1 is a simplified schematic block diagram of an ADPCM CODEC (coder-decoder) in which the present invention can be advantageously utilized.

Turning now to the drawings, FIG. 1 shows an ADPCM CODEC system in which adaptive prediction in accordance with the present invention can be used to advantage. The system shown in FIG. 1 is, in fact, the ADPCM CODEC of the above cited Petr patent application. The coder 100 receives input linear PCM samples and encodes the same into an n-bit differential PCM signal for transmission to the ADPCM decoder 101 over the transmission facility 102. For purposes of illustration, a 4-bit differential PCM signal (n=4) was assumed. This 4-bit differential signal in conjunction with the ADPCM coding algorithm provides very reliable transmission for both speech and higher speed, voiceband data (e.g., 4800 bps).

The multi-bit (e.g., 13–16 bits) linear PCM samples s are delivered to an algebraic adder or difference circuit 11. The samples s could also be PAM samples. The linear PCM samples may result from the direct encoding of an input speech signal or voiceband data to linear PCM. Alternatively, an input 8-bit μ-law encoded signal may first be converted to its multi-bit linear counterpart. And, of course, other non-uniform signals such as an A-law signal may also first have to be converted to its linear PCM counterpart. Such conversions are known in the art.

An adaptive predictor 12 provides a predicted signal $s_e$ which is a prediction or an estimate of the sample s. This predicted signal $s_e$ is inverted in inverter 13 and delivered to the other input of the adder circuit 11. As the name implies, the latter circuit provides at its output a difference signal d that is the algebraic addition of the two inputs thereto. The difference signal d is coupled to the input of the dynamic locking quantizer (DLQ). The DLQ comprises a 16 level (for n=4) non-uniform quantizer 14 of scale factor Δ. As will be appreciated by those in the art, the quantizer 14 not only provides the desired quantization, but it also serves to PCM encode the input signal; the quantizing and encoding are carried out in one-and-the-same operation (see any standard digital transmission text). The 4-bit output signal I represents the quantized and PCM encoded form of the difference sample d.

The 4-bit PCM output is delivered to the $Q^{-1}$ inverse quantizer 15 which, as the designation implies, performs an operation that is essentially the inverse of the operation of block 14. That is, the inverse quantizer 15 receives the 4-bit differential PCM signal I and provides at its output the signal $d_q$. This $d_q$ signal is the quantized version of the difference signal d. The signal $d_q$ is coupled to the input of the Q adaptation circuit 16 and to the adder 17. The $s_e$ output of the adaptive predictor 12 is also coupled to an input of the adder 17. The adder 17 serves to add these two input signals so as to provide at its output the reconstructed signal r, which is a close quantized version of the input signal s. The signal sample r is delivered to the adaptive predictor 12, which in response thereto serves to generate the next predicted signal for comparison with the next linear PCM sample. The adaptive predictor 12 uses the sample r and a few previous samples to arrive at a prediction $s_e$ which is the weighted sum of m input samples (e.g., m=4).

The Q adaptation circuit 16 receives the quantized difference signal $d_q$ and the 4-bit output I and serves to develop therefrom the adaptive scale factor Δ. This scale factor Δ is then delivered to the quantizer 14 and to the inverse quantizer 15. The adaptive scale factor Δ serves to scale the Q and $Q^{-1}$ characteristics to match the power of the input difference signal d. The Q adaptation circuit controls the speed of adaptation of the scale factor Δ; a fast speed of adaptation is provided when the input linear PCM signal represents speech, with a very slow (almost constant) speed of adaptation for input PCM encoded voiceband data or tones.

The 4-bit differential PCM signal is transmitted, in typical time-division multiplexed fashion, over the digital transmission facility 102 and is delivered to the input of the $Q^{-1}$ inverse quantizer 115. This input signal is designated I', the prime indicating that it is close to and yet, perhaps, not identical with the signal I due to transmission errors. Similarly, the other letter symbols used in the decoder 101 are primed to indicate that they are close to but perhaps not identical with the similarly designated symbols or signals of the coder 100. The $Q^{-1}$ quantizer 115 is identical to the $Q^{-1}$ quantizer 15 and it serves to provide at its output the quantized signal $d_q'$. Again, as before, $d_q'$ represents the quantized version of the difference signal d, with the prime indicating a possible variation therefrom due to transmission errors. The quantized signal $d_q'$ is coupled to the input of the Q adaptation circuit 116 and the adder 117. The input differential PCM signal I' is also coupled to the input of the Q adaptation circuit 116; this circuit is identical to the Q adaptation circuit 16 of the coder (100). The output of the Q adaptation circuit 116 is the adaptive scale factor Δ' which is delivered to the $Q^{-1}$ quantizer 115 for the same purpose as previously described. The adaptive predictor 112 serves to generate the predicted signal $s_e'$ which is coupled to the other input of the adder 117. The adaptive predictor 112 is identical to the adaptive predictor 12 of the coder 100. The adder 117 serves to digitally add the two input signals to produce the reconstructed signal r' which is a close quantized version of the original input signal s. The signal r' is delivered to the input of the adaptive predictor 112, and to the output where it is utilized to reconstruct a replica of the original input speech or voiceband data signal.

For comparison purposes, the adaptive predictor circuit 12 of the Petr application is shown in some detail in FIG. 1. The adaptive predictor 12 is a fourth order adaptive predictor which comprises a 4-tap adaptive transversal filter 41 and a coefficient update circuit 42 for the same. The absolute value of r (i.e., $|r|$) is derived in circuit 44 and delivered to the single-pole, digital, low-pass filter 45 of short time constant. The output of the latter circuit is coupled to the threshold comparator 43 wherein it is compared with a signal dms derived from the Q adaptation circuit 16. As a result of this comparison, two values of c are coupled to coefficient update circuit 42. The variable c controls the speed of adaptation of the predictor by controlling the speed of operation of the coefficient update. There is a first or normal speed for input speech and voiceband data, and a second, lower or reduced speed of operation which is desirable for narrowband signals (e.g., tone signals).

Figure 2:
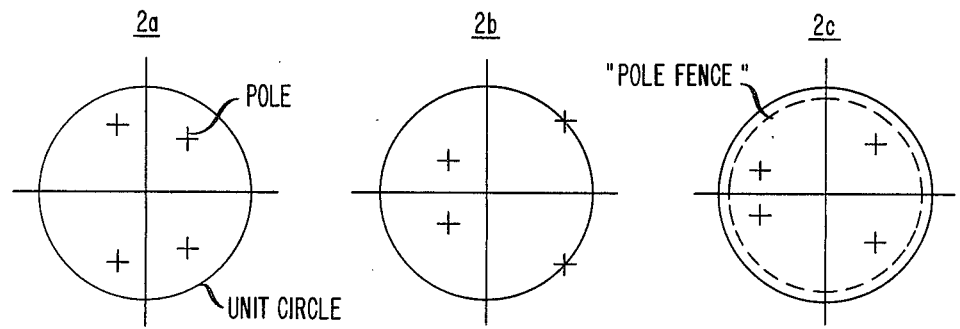
FIG. 2 shows pole zero diagrams which illustrate the operation of the invention.

FIG. 2 shows pole zero diagrams which should prove useful in understanding the present invention. It is known to those skilled in the art that a linear predictor determined by the tap coefficients ($a_i$) can be represented uniquely by the holes of the transfer function of the inverse predictor. The inverse predictor is the function whose input is the quantized difference signal $d_q$ and whose output is the reconstructed signal r. The poles of the Z transfer function of the inverse predictor uniquely represent the predictor. The poles of a typical fourth order inverse predictor are plotted in the complex Z plane as shown in FIG. 2a. Such pole plots are useful in characterizing the stability of inverse predictors. It is important to maintain the stability of inverse predictors, otherwise severe distortion of the reconstructed signal could result. The unit circle shown in FIG. 2 is a boundary that is used to determine the stability properties of the inverse predictor. If all the poles are inside the unit circle, then the inverse predictor is stable; if there are any poles outside the unit circle, then it is unstable; if there are poles on the unit circle and any other poles inside the unit circle, when it is marginally stable. An example of the pole configuration of a marginally stable inverse predictor is shown in FIG. 2b. This pole configuration causes poor CODEC performance in the presence of transmission errors. In this situation, the speed of the predictor adaptation must be set for suboptimal performance. If there is no satisfactory criterion to determine this condition, then the overall performance of the predictor would be suboptimal for all signals in order to provide satisfactory performance in the presence of transmission errors.

Inverse predictors that are marginally stable correspond to narrowband input signals, such as tones, and are sensitive to the effects of transmission errors. Therefore, it is desirable to avoid using predictors that correspond to marginally stable inverse predictors. The "pole fence" stability criterion in accordance with the invention essentially establishes a boundary defined by the dashed curve shown in FIG. 2c. If any pole of the inverse predictor might fall outside of this boundary, then the stability criterion identifies this condition and appropriate action is taken to cause the pole(s) to fall inside the boundary. This is accomplished by significantly reducing the speed of the coefficient adaptation process. The net effect is that marginally stable inverse predictors are avoided and overall CODEC performance is improved. Stated somewhat differently, the pole fence stability criterion of the invention identifies a predictor state for which the poles are very close to (or outside of) the unit circle. This criterion is used in the predictor adaptation process to obtain optimal performance for speech and voiceband data, was well as good performance for narrowband signals such as tones. The radial displacement of the pole fence circle from the unit circle is controlled by the value T chosen for the threshold signal to be described hereinafter. However, this pole fence is not necessarily a circle, as shown in FIG. 2c, but may be somewhat ellipsoidal or any other smooth curve. The shape is relatively unimportant, it is the function that is of importance.

Figure 3:
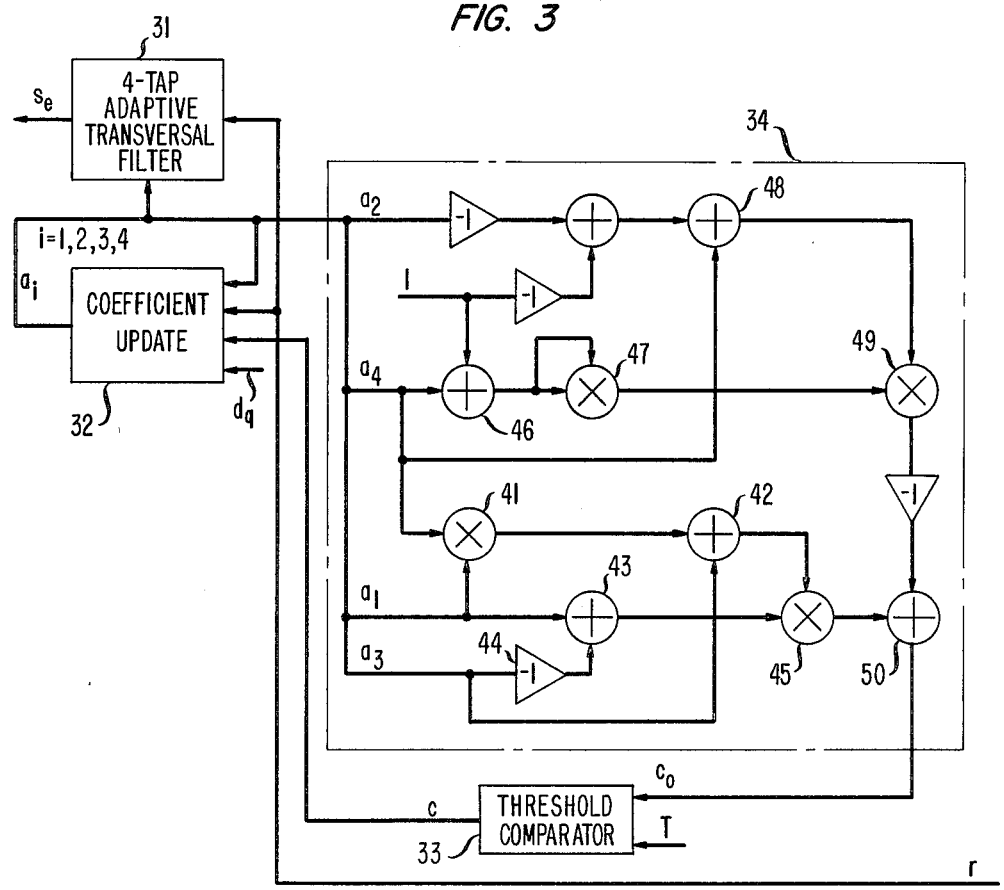
FIG. 3 is a schematic block diagram of an adaptive predictor constructed in accordance with the principles of the present invention.

An adaptive predictor circuit in accordance with the principles of the present invention is shown in FIG. 3 of the drawings. The reconstructed signal r (or r') is coupled to the input of the adaptive transversal filter 31, which for purposes of illustration shall be assumed to be a four-tap transversal filter, and to the input of the coefficient update circuit 32. The transversal filter 31 is of conventional design and its output $s_e$ is equal to the sum of the coefficients $a_i$ multiplied by past samples of the reconstructed signal r:

$$s_e = \sum_{i=1}^{4} a_i \cdot r_{(-i)} \quad (1)$$

The transversal filter 31, therefore, is assumed to comprise four-taps and thus four prior samples of r are multiplied by coefficient $a_i$, where i=1, 2, 3, 4. The signal(s) $a_i$ are provided by coefficient update circuit 32. This latter circuit is a simplified form of the gradient adaptation algorithm which is a known technique for driving an adaptive transversal filter. The update circuit 32 has four inputs. The first is the reconstructed signal r, another is its own output signal $a_i$, a third input is the signal c derived from the threshold comparator 33, and the final one is the $d_q$ signal from $Q^{-1}$ quantizer 15.

Given the four described input signals to the coefficient update circuit 32, its function can be described mathematically as follows:

$$a_i = l^i \cdot a_{i(-1)} + c \cdot \mathrm{sgn}(d_q) \cdot \mathrm{sgn}(r_{(-i)}) \quad (2)$$

for i=1, 2, 3, 4, and, for example, l=0.998.

The output $a_i$ is derived by multiplying the last $a_i$ by the constant 1 raised to the power i, and the result of this multiplication is then added to the variable c multiplied by both the sign of the signal $d_q$ and the sign of the signal $r_{(-i)}$. As will be obvious to those in the art, these operations comprise straightforward multiplication and algebraic addition. The variable c in the foregoing equation (2) controls the speed of adaptation of the predictor. The constant l(l<1) introduces finite memory into the adaptation process so as to reduce the effect of transmission errors.

The $a_i$ signal output of the coefficient update circuit 32 is also coupled to the input of the logic circuit 34, to be described in detail hereinafter. The logic circuit 34 calculates a predetermined function ($c_o$) of the tap coefficients ($a_1, a_2, a_3, a_4$) and if that function is greater than a given threshold T, a narrowband signal is not present and a normal speed of operation of the coefficient update circuit 32 is permitted. However, if the calculated function $c_o$ is less than the threshold T, a narrowband signal is concluded and the speed of the coefficient update is substantially reduced. The threshold comparator 33 determines whether this calculated function $c_o$ is greater or less than the threshold T.

The variable c output of the threshold comparator 33 is of only one of two values, $c = c_1$ or $c = c_2$, where $c_1 > c_2$. The function of the threshold comparator can best be described mathematically as follows:

If $c_o > T$
then, $c = c_1$
otherwise, $c = c_2$
where, for example, $c_1 = 2^{-7}$, $c_2 = 2^{-9}$, and
T = 0.25

The values given above for $c_1$, $c_2$ and T are the same as those given in the cited D. W. Petr patent application. Where this present invention differs from that of the Petr application is in its improved identification of those narrowband signals that cause increased ADPCM CODEC sensitivity to transmission errors.

The logic circuit 34 serves, in effect, to establish the pole fence criterion, heretofore described. The function of this logic circuit can be described mathematically as follows:

$$c_o = (a_3 + a_1 a_4)(a_1 - a_3) - (1 + a_4)^2(a_4 - a_2 - 1) \quad (3)$$

Considering the logic circuit 34 in more detail, the tap coefficients $a_1$ and $a_4$ are multiplied in multiplier 41 and the result is added to $a_3$ in the adder 42. Thus, the output of adder 42 constitutes the first term $(a_3 + a_1 a_4)$ of equation (3). The output of adder 43 is the second term $(a_1 - a_3)$ of equation (3). The $a_3$ tap coefficient is inverted in inverter 44 and this inverted signal $(-a_3)$ is combined with $a_1$ in the algebraic adder 43. These first and second terms are then multiplied together in multiplier 45. The adder 46 adds a "1" with tap coefficient $a_4$ and the result is then squared in multiplier 47 to provide the third term $(1 + a_4)^2$ of equation (3). The $a_2$ coefficient is inverted, the "1" is inverted, and the sum $(-a_2 - 1)$ is subtracted from $a_4$ in the adder 48 to provide the fourth term $(a_4 - a_2 - 1)$. These third and fourth terms are multiplied together in the multiplier 49. The output of multiplier 49 $((1 + a_4)^2(a_4 - a_2 - 1))$ is inverted and then subtracted from the output of multiplier 45 $((a_3 + a_1 a_4)(a_1 - a_3))$. This last algebraic addition is carried out in adder 50, the output of which is the function $c_o$.

If the adaptive predictor is implemented in integrated circuit form, the tap coefficients $a_1$, $a_2$, $a_3$, $a_4$ should preferably be delivered concurrently to the respective inputs of logic circuit 34. In this case, the coefficient update 32 provides the tap coefficients $a_1$, $a_2$, $a_3$, $a_4$ in a parallel format. That is, it calculates these four tap coefficients at one-in-the-same time. A series output of the tap coefficients $a_i$ can, of course, also be realized if appropriate steering and delay circuitry precedes the logic circuit 34. If the adaptive predictor is implemented by means of a digital signal processor, the generation of the tap coefficients $a_i$ and the processing of the same in accordance with equation (3) can be considered a serial operation. This will be apparent to those skilled in the art.

Various modifications of the disclosed adaptive predictor should be readily apparent at this point. For example, this adaptive predictor is not limited to use with the ADPCM CODEC of the Petr patent application and can find use in other and different ADPCM systems. Moreover, the concept of the invention is not limited to a $4^{th}$ order adaptive predictor and could find use in a $5^{th}$ or $6^{th}$ . . . order adaptive predictor. The logic circuit 34 would necessarily be different but such a circuit can be arrived at by one skilled in the art. The values of $c_1$, $c_2$, and "T" are given only by way of example and can be readily changed as the system designer deems appropriate for a given system application. Without further belaboring the point, it should be obvious at this time that the above described arrangement is merely illustrative of the application and principles of the present invention and numerous modifications thereof may be devised by those skilled in the art without departing from the spirit and scope of the invention.

What is claimed is:

1. An adaptive predictor (FIG. 3) for use in an adaptive differential PCM system comprising an n-tap adaptive transversal filter (31), a coefficient update circuit (32) for providing the tap coefficients for said transversal filter, and means (33,34) for controlling the speed of operation of said coefficient update to achieve a fast speed when the input signal to the differential PCM system represents speech or voiceband data and a slow speed of operation when said input represents narrowband signals such as tones, the controlling means being characterized by logic means (34) receiving said tap coefficient and calculating a predetermined function of said tap coefficients, and means (33) for comparing said predetermined function to a given threshold to produce a variable (c) having one of two values, the variable (c) serving to dynamically change the adaptation speed of the tap coefficients so that a fast speed of adaptation is achieved when said input signal represents speech or voiceband data and a substantially reduced speed is realized when said input signal represents narrowband signals.

2. An adaptive predictor (FIG. 3) for use in an adaptive differential PCM system comprising an n-tap adaptive transversal filter (31), a coefficient update circuit (32) for providing the tap coefficients for said transversal filter, and means for controlling the speed of operation of said coefficient update to achieve a fast speed when the input signal to the differential PCM system represents speech or voiceband data and a slow speed of operation when said input represents narrowband signals such as tones, the controlling means being characterized by logic circuit means (34) receiving said tap coefficients and deriving a predetermined function of said tap coefficients, and means (33) for comparing said predetermined function to a given threshold so that a fast speed of operation of said coefficient update is achieved when said predetermined function is greater than said threshold and a substantially reduced speed of operation is achieved when said predetermined function is less than said threshold.

3. An adaptive predictor (FIG. 3) comprising an n-tap adaptive transversal filter (31), a coefficient update circuit (32) for providing the tap coefficients for said transversal filter, and means (33,34) responsive to the output of said coefficient update for dynamically changing the adaptation speed of the tap coefficients depending upon the location of the poles with respect to a unit circle in the Z domain so that the stability margin for narrowband signals is increased without degrading performance for speech and voiceband data.

4. An $n^{th}$ order adaptive predictor for use in an ADPCM CODEC comprising an n-tap adaptive transversal filter (31), a coefficient update circuit (32) for providing n-tap coefficients ($a_i$) for said transversal filter, logic means (34) receiving said tap coefficients and calculating a predetermined function of the tap coefficients, comparator means (33) for comparing the calculated function against a given threshold to produce a variable (c) having one of two values, the variable (c) having a first value ($c_1$) when said calculated function is greater than said threshold and a second value ($c_2$) when said calculated function is less than said threshold, and means coupling said variable to said coefficient update to control the speed of the latter so that a fast speed of operation is achieved when the input signal to the CODEC represents speech or voiceband data and a substantially reduced speed is achieved when said input represents narrowband signals.

5. An adaptive predictor as defined in claim 4 wherein the first value $c_1$ controls the coefficient update to achieve said fast speed of operation, and $c_1 > c_2$.

6. An adaptive predictor as defined in claim 4 wherein n=4.

7. An adaptive predictor as defined in claim 6 wherein the calculated function ($c_o$) is given by the equation:

$$c_o = (a_3 + a_1 a_4)(a_1 - a_3) - (1 + a_4)^2 (a_4 - a_2 - 1)$$

8. An adaptive prediction method for use in the adaptive differential PCM coding and decoding of speech, voiceband data and narrowband signals such as tones comprising the steps of generating coefficients $a_i$ where i=1,2 . . . n, forming a signal $s_e$ in accordance with the equation $$s_e = \sum_{i=1}^{n} a_i \cdot r(-i)$$

where r is a reconstructed signal corresponding to the input speech, voiceband data or narrowband signal, calculating a predetermined function of the coefficients $a_i$, comparing the calculated function against a given threshold to produce a variable (c) having one or two values, and utilizing the variable (c) to dynamically change the adaptation speed of the coefficients so that a fast speed is achieved for input speech and voiceband data and a substantially reduced speed is achieved for narrowband signals.

9. An adaptive prediction method as defined in claim 8 wherein n=4, and the calculated function ($c_o$) is given by the equation:

$$c_o = (a_3 + a_1 a_4)(a_1 - a_3) - (1 + a_4)^2 (a_4 - a_2 - 1).$$

* * * * *